US008284600B1

(12) United States Patent
Poplevine et al.

(10) Patent No.: US 8,284,600 B1
(45) Date of Patent: Oct. 9, 2012

(54) 5-TRANSISTOR NON-VOLATILE MEMORY CELL

(75) Inventors: Pavel Poplevine, Burlingame, CA (US); Ernes Ho, Sunnyvale, CA (US); Umer Khan, Santa Clara, CA (US); Hengyang James Lin, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 278 days.

(21) Appl. No.: 12/702,061

(22) Filed: Feb. 8, 2010

(51) Int. Cl.
*G11C 11/34* (2006.01)

(52) U.S. Cl. .............. 365/185.05; 365/72; 365/104; 365/185.1; 365/185.14; 365/185.26

(58) Field of Classification Search .............. 365/185.1, 365/185.05, 185.14, 185.26, 104, 72
See application file for complete search history.

(56) References Cited

U.S. PATENT DOCUMENTS

| 5,594,687 | A | 1/1997 | Lin et al. ............ 365/185.1 |
| 6,137,723 | A | 10/2000 | Bergemont et al. ...... 365/185.18 |
| 6,191,980 | B1 * | 2/2001 | Kelley et al. ............ 365/185.29 |
| 6,903,978 | B1 | 6/2005 | Mirgorodski et al. ... 365/185.28 |
| 6,992,927 | B1 | 1/2006 | Poplevine et al. ...... 365/185.05 |
| 7,042,763 | B1 * | 5/2006 | Mirgorodski et al. ... 365/185.05 |
| 7,164,606 | B1 | 1/2007 | Poplevine et al. ...... 365/185.28 |
| 7,167,392 | B1 | 1/2007 | Poplevine et al. ...... 365/185.08 |
| 7,889,553 | B2 * | 2/2011 | Terzioglu et al. ......... 365/185.1 |
| 2004/0129971 | A1 * | 7/2004 | Owen .................. 257/316 |
| 2007/0070707 | A1 * | 3/2007 | Yamamoto et al. ...... 365/185.23 |
| 2008/0205144 | A1 * | 8/2008 | Yamamoto et al. ...... 365/185.05 |
| 2008/0225601 | A1 | 9/2008 | Ratnakumar et al. .... 365/185.29 |
| 2009/0262584 | A1 * | 10/2009 | Kamiya .................. 365/185.29 |

OTHER PUBLICATIONS

"Notification of Transmittal of the International Search Report and the Written Opinion of the International Searching Authority", PCT/US2010/058214, mailing date: Jul. 27, 2011.

* cited by examiner

*Primary Examiner* — Pho M Luu
*Assistant Examiner* — Thao Bui
(74) *Attorney, Agent, or Firm* — Wade J. Brady, III; Frederick J. Telecky, Jr.

(57) ABSTRACT

A non-volatile memory (NVM) cell comprises an NMOS control transistor having commonly-connected source, drain and bulk region electrodes and a gate electrode connected to a storage node; a PMOS erase transistor having commonly-connected source, drain and bulk region electrodes and a gate electrode connected to the storage node; an NMOS data transistor having source, drain and bulk region electrodes and a gate electrode connected to the storage node, the bulk region electrode being connected to a common bulk node; the first NMOS pass gate transistor having a source electrode connected to the drain electrode of the NMOS data transistor, a drain electrode, a bulk region electrode connected to the common bulk node, and a gate electrode; and a second NMOS pass gate transistor having a drain electrode connected to the source electrode of the NMOS data transistor, a source electrode, a bulk region electrode connected to the common bulk node, and a gate electrode.

7 Claims, 4 Drawing Sheets

5-TRANSISTOR NON-VOLATILE MEMORY CELL

FIELD OF THE INVENTION

The present invention relates to integrated circuit memory devices and, in particular to a 5-transistor non-volatile memory (NVM) cell that facilitates an increase in the voltage difference between the floating gate of a programmed NVM cell in an NVM cell array and the floating gate of a non-programmed NVM cell in the array.

BACKGROUND OF THE INVENTION

U.S. Pat. No. 7,164,606 B1, which issued on Jan. 16, 2007, to Poplevine et al., discloses an all-PMOS 4-transistor non-volatile memory (NVM) cell that utilizes reverse Fowler-Nordheim tunneling for programming.

Referring to FIG. 1, as disclosed in U.S. Pat. No. 7,164,606, in accordance with the method of programming an NVM array that includes all-PMOS 4-transistor NVM cells having commonly-connected floating gates, for each cell in the array that is to be programmed, all of the electrodes of the cell are grounded. Then, an inhibiting voltage $V_n$ is applied to the bulk-connected source region $V_r$ of the cell's read transistor $P_r$, to the commonly-connected drain, bulk and source regions $V_e$ of the cell's erase transistor $P_e$, and to the drain region $D_r$ of the read transistor $P_r$. The source region $V_p$ and the drain region $D_p$ of the cell's programming transistor $P_w$ are grounded. The bulk $V_{nw}$ of the programming transistor $P_w$ is optional; it can be grounded or it can remain at the inhibiting voltage $V_n$. For all cells in the array that are not selected for programming, the inhibiting voltage $V_n$ is applied to electrodes $V_r$, $V_e$ and $D_r$ and is also applied to electrodes $V_p$, $D_p$ and $V_{nw}$. The control voltage $V_c$ of the cell's control transistor $P_c$ is then swept from 0V to a maximum programming voltage $V_{cmax}$ in a programming time $T_{prog}$. The control gate voltage $V_c$ is then ramped down from the maximum programming voltage $V_{cmax}$ to 0V. All electrodes of the cell and the inhibiting voltage $V_n$ are then returned to ground.

As described in detail in the '606 patent, the all-PMOS 4-transistor NVM cell disclosed therein relies on reverse Fowler-Nordheim tunneling for programming. That is, when the potential difference between the floating gate electrode of the programming transistor of an all-PMOS NVM cell and the drain, source and bulk electrodes of the programming transistor exceeds a tunneling threshold voltage, electrons tunnel from the drain and source electrodes to the floating gate, making the floating gate negatively charged.

U.S. Pat. No. 7,164,606 is hereby incorporated by reference herein in its entirety to provide background information regarding the present invention.

The all-PMOS 4-transistor NVM cell programming technique disclosed in the '606 patent provides advantages of both low current consumption, allowing the ability to simultaneously program a large number of cells without the need for high current power sources, and a simple programming sequence. However, as discussed above, during the programming sequence, the drain and source regions of the read transistor $P_r$ and of the programming transistor $P_w$ of non-programmed NVM cells in the array are set to a fixed inhibiting voltage $V_n$, while the $V_e$ electrode of the erase transistor Pe is set to the inhibiting voltage $V_n$ and the $V_c$ electrode of the control transistor $P_c$ is ramped up from 0V to $V_{cmax}$. As a result, negative charge is trapped on the floating gate of the non-programmed cells, even though the amount of trapped charge is less than the negative charge that is trapped on the floating gate of the programmed cells. This sets the voltage level of the floating gate of a non-programmed cell to about $V_n$ above the voltage level of the floating gate of a programmed cell. This means that the maximum possible voltage difference between the floating gate of a programmed cell and the floating gate of a non-programmed cell is $V_n$. Non-programmed cells with this condition are referred to as "disturbed cells."

Thus, there is a need for an NVM cell design that increases the voltage difference between the floating gate of a programmed NVM cell and a non-programmed NVM cell, but retains the advantages of the all-PMOS 4 transistor NVM cell.

SUMMARY OF THE INVENTION

The present invention provides a method of programming a non-volatile memory (NVM) cell array that includes a plurality of NVM cells. Each NVM cell in the array includes an NMOS control transistor having commonly-connected source, drain and bulk region electrodes and a gate electrode connected to a storage node, a PMOS erase transistor having commonly-connected source, drain and bulk region electrodes and a gate electrode connected to the storage node, an NMOS data transistor having source, drain and bulk region electrodes and a gate electrode connected to the storage node, the bulk region electrode being connected to a common bulk node, a first NMOS pass gate transistor having a source electrode connected to the drain electrode of the NMOS data transistor, a drain electrode connected to a first array bit line, a bulk region electrode connected to the common bulk node and a gate electrode connected to a first array word line, and a second NMOS pass gate transistor having a drain electrode connected to the source electrode of the NMOS data transistor, a source electrode connected to a second array bit line, a bulk region electrode connected to the common bulk node and a gate electrode connected to a second array word line. The NVM cell array programming method comprises: for each NVM cell in the array, setting the source, drain, bulk region and gate electrodes of the NMOS control transistor, the PMOS erase transistor and the NMOS data transistor of the NVM cell to 0V; for each cell in the array selected for programming, setting the first array word line to a positive inhibiting voltage and the corresponding second bit line to 0V, or setting the second array word line to the positive inhibiting voltage and the corresponding second bit line to 0V, or both, and setting the common bulk node to 0V; for each cell in the array not selected for programming, setting the first and second array word lines to 0V while setting either the first or second array bit line (or both) to the positive inhibiting voltage or 0V, and setting the common bulk node to 0v; ramping up the control voltage from 0V to a positive control voltage and the erase voltage from 0V to a positive erase voltage for a predefined programming time; ramping down the control voltage from the positive control voltage to 0V and the erase voltage from the positive erase voltage to 0V; and returning all electrodes set to the positive inhibiting voltage to 0V.

The features and advantages of the present invention will be more fully understood and appreciated upon consideration of the following detailed description of the invention and the accompanying drawings, which set forth illustrative embodiments in which the concepts of the invention are utilized.

DETAILED DESCRIPTION OF THE INVENTION

Figure 1:
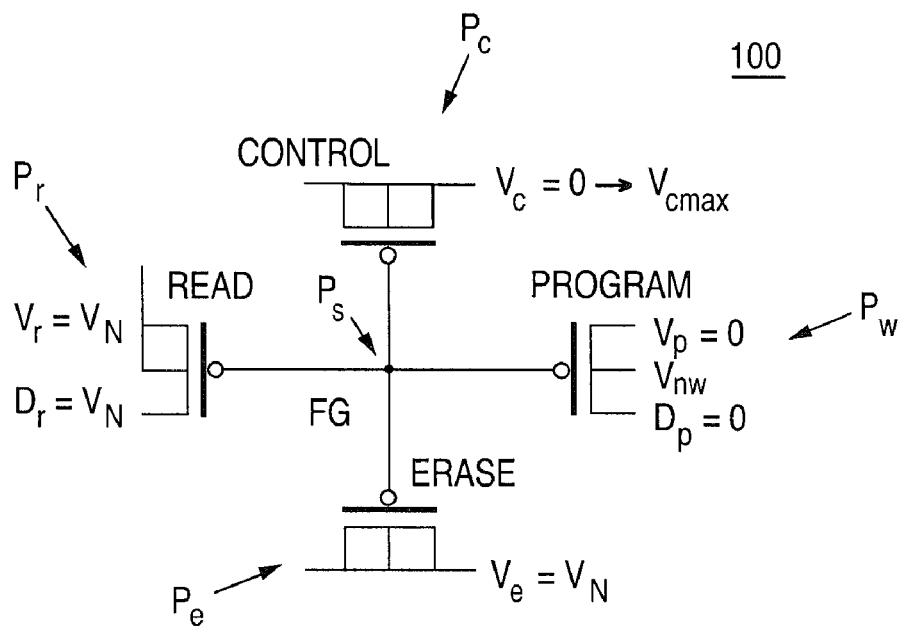
FIG. 1 is a schematic diagram illustrating an all-PMOS 4-transistor NVM cell.
Figure 2:
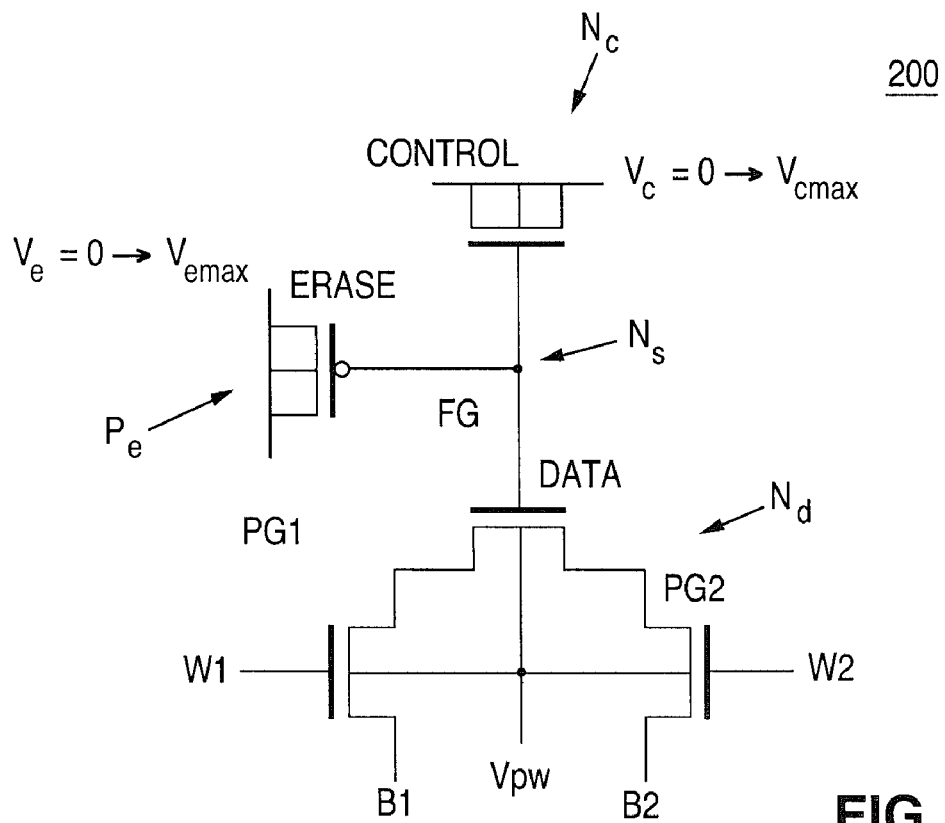
FIG. 2 is a schematic diagram illustrating an embodiment of a 5-transistor NVM cell in accordance with the concepts of the present invention.

FIG. 2 shows an embodiment of a 5-transistor non-volatile memory (NVM) cell 200 in accordance with the concepts of the present invention that advantageously modifies the all-PMOS 4-transistor NVM cell 100 shown in FIG. 1. More specifically, the 5-transistor NVM cell 200 replaces the PMOS control transistor $P_c$ of the all-PMOS cell 100 with an NMOS control transistor $N_c$ having commonly-connected source, drain and bulk region electrodes that receive a control voltage $V_c$; the gate electrode of the NMOS control transistor $N_c$ is connected to a storage node $N_s$. The NVM cell 200 also includes a PMOS erase transistor $P_e$ having commonly-connected source, drain and bulk region electrodes that receive an erase voltage $V_e$; the gate electrode of the erase transistor $P_e$ is connected to the storage node $N_s$. The FIG. 2 5-transistor NVM cell 200 replaces the PMOS read transistor $P_r$ and the PMOS program transistor $P_w$ of the FIG. 1 all-PMOS NVM cell 100 with a single NMOS data transistor $N_d$ that has its gate electrode connected to the storage node $N_s$. The 5-transistor NVM cell 200 also includes a first NMOS pass gate transistor PG1 and a second NMOS pass gate transistor PG2. The first NMOS pass gate transistor PG1 is connected between the source electrode of the data transistor $N_d$ and a first NVM cell array bit line B1; the gate electrode of the first NMOS pass gate transistor PG1 is connected to a first NVM cell array word line W1. The second NMOS pass gate transistor PG2 is connected between the drain electrode of the data transistor $N_d$ and a second NVM cell array bit line B2; the gate electrode of the second NMOS pass gate transistor PG2 is connected to a second NVMN cell array word line W2. The bulk region electrodes of the data transistor $N_d$, the first NMOS pass gate transistor PG1 and the second NMOS pass gate transistor are commonly-connected to receive a bulk region programming voltage $V_{pw}$.

Figure 3:
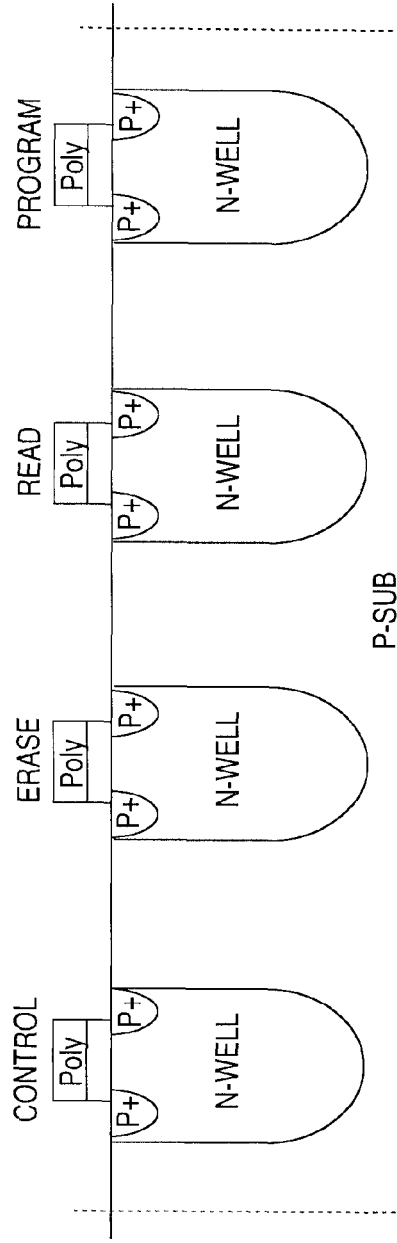
FIG. 3 is a cross-section drawing illustrating the FIG. 1 all-PMOS 4-transistor NVM cell.
Figure 4:
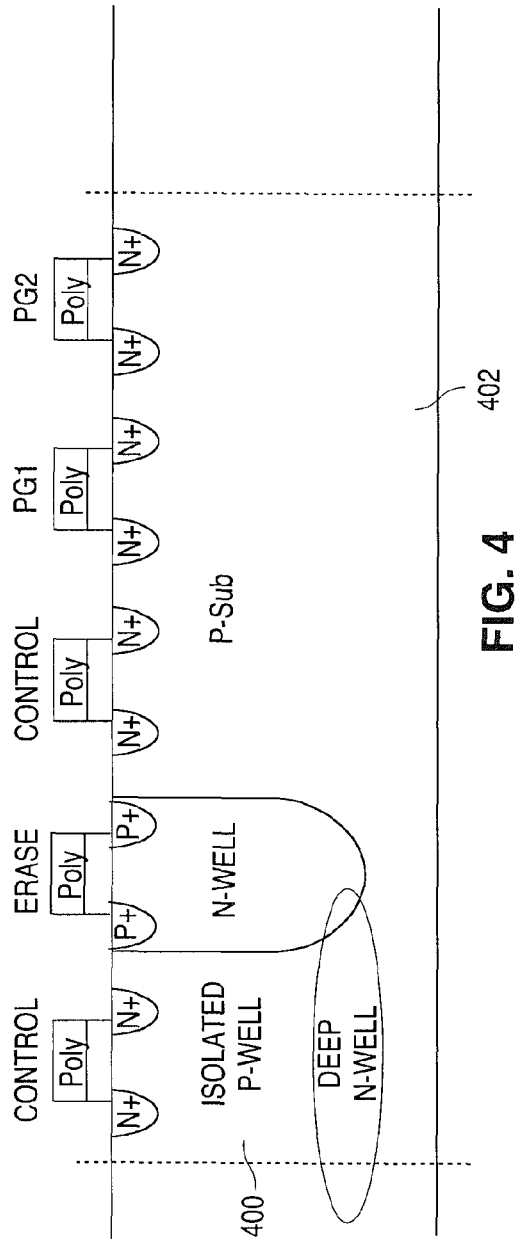
FIG. 4 is a cross-section drawing illustrating a structural embodiment of the FIG. 2 a 5-transistor NVM cell in accordance with the concepts of the present invention.
Figure 5:
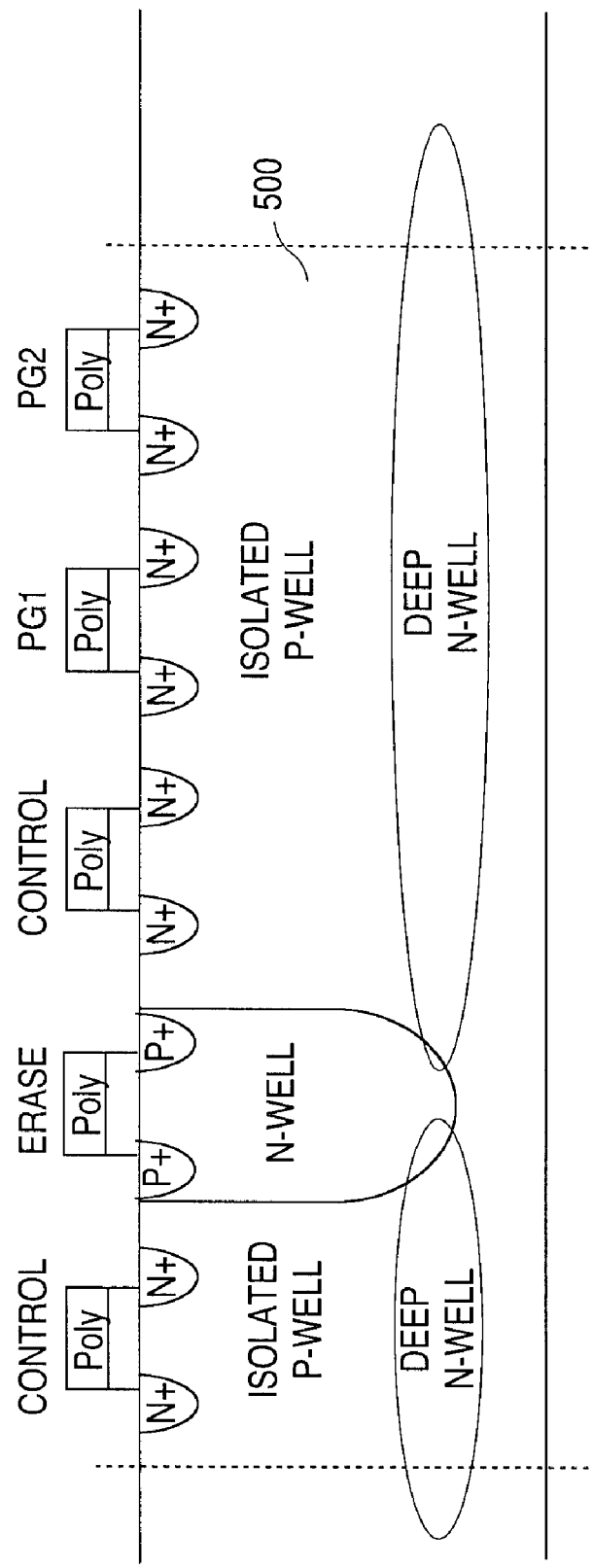
FIG. 5 is a cross-section drawing illustrating an alternate structural embodiment of the FIG. 2 5-transistor NVM cell in accordance with the concepts of the present invention.

FIG. 3 shows a cross section of the FIG. 1 all-PMOS 4-transistor NVM cell 100 with large N-well spacing between the PMOS transistors. FIG. 4 shows a cross section of the FIG. 2 5-transistor NVM cell 200. As shown by the dashed vertical lines in FIGS. 1 and 2, the FIG. 2 5-transistor NVM cell 200 has a more compact design than the FIG. 1 all-PMOS NVM cell 100. FIG. 4 also shows that the NMOS control transistor $N_c$ of the FIG. 2 NVM cell is built in an isolated P-well 400. FIG. 4 further shows that the bulk (substrate) regions of the NMOS data transistor $N_d$, the first NMOS pass gate transistor PG1 and the second NMOS pass gate transistor PG2 of the NVM cell 200 are commonly connected via the P-substrate 402. FIG. 5 shows a cross section of an alternate embodiment of the NVM cell 200 wherein the commonly-connected bulk regions of the NMOS data transistor $N_d$, the first NMOS pass gate transistor PG1 and the second NMOS pass gate transistor PG2 are formed in an isolated P-well 500.

The dashed vertical lines in the FIG. 5 alternate embodiment show that it is the same size as the FIG. 4 embodiment and, thus, more compact than the FIG. 3 all-PMOS cell.

Figure 6:
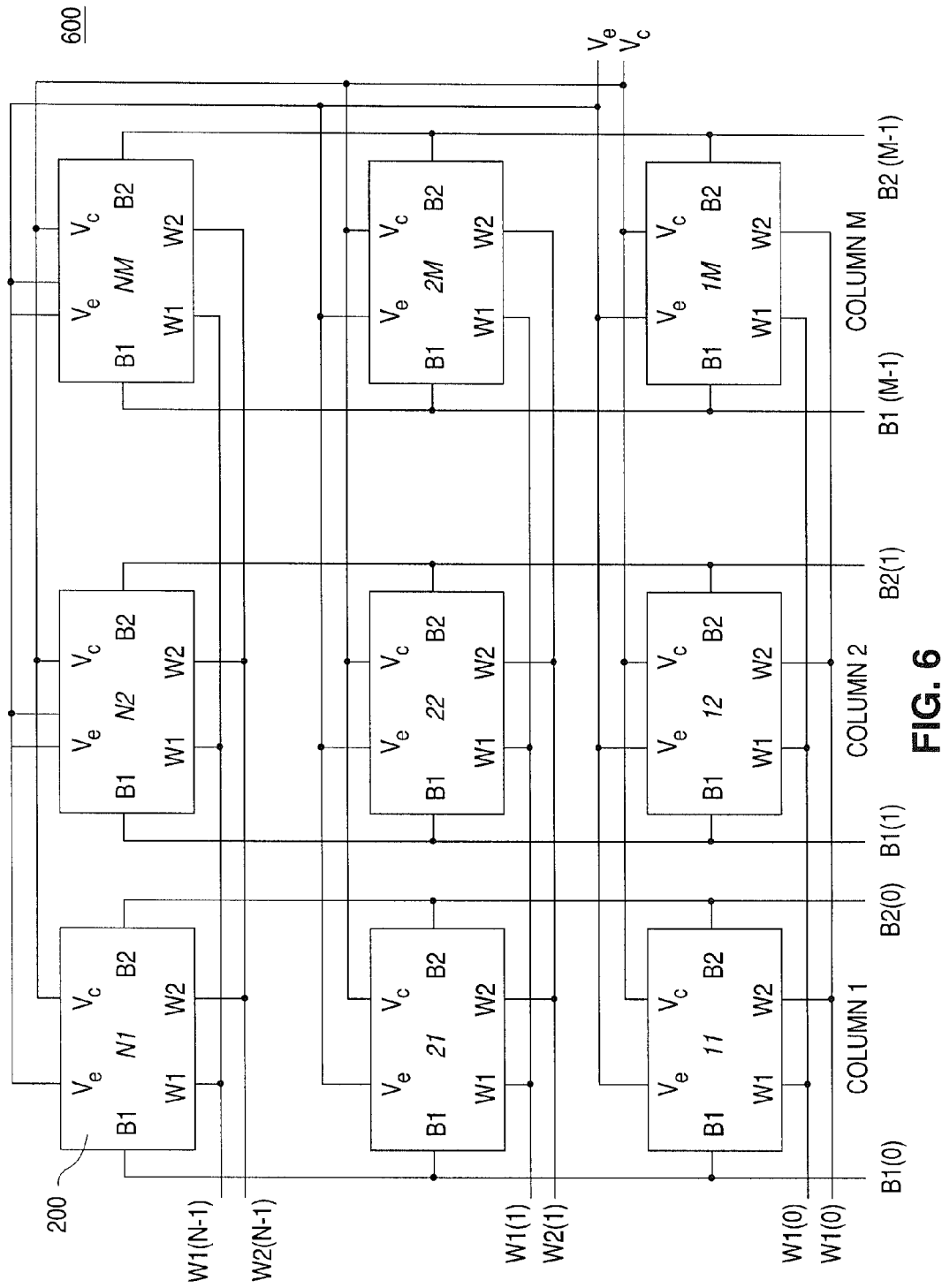
FIG. 6 is a schematic diagram illustrating an embodiment of an NVM cell array comprising a plurality of 5-transistor NVM cells of the type illustrated in FIG. 2.

FIG. 6 shows a plurality of 5-transistor NVM cells 200 of the type described above with respect to FIG. 2 incorporated into a NVM cell array 600.

With reference to FIGS. 2 and 6, the program, erase and read sequences for the 5-transistor NVM cell 200 in an array 600 are as follows:

Program Sequence

All electrodes of the cell 200 are set to 0V. For all cells in the array 600 selected to be programmed, set either the first array word line W1 to a positive inhibiting voltage $V_n$ and the corresponding first array bit line B1 to 0V, or set the second array word line W2 to the positive inhibiting voltage $V_n$ and the corresponding second bit line B2 to 0V , or both; the bulk region electrode $V_{pw}$ is also set to 0V. For all cells 200 in the array 600 not selected to be programmed, set both the first array word line W1 and the second array word line W2 to 0V and set either the first array bit line B1 or the second array bit line B2, or both, to the positive inhibiting voltage $V_n$ or 0V; the bulk region electrode $V_{pw}$ is set to 0V. Next, ramp up the control voltage $V_c$ from 0V to a positive maximum control voltage $V_{cmax}$ and the erase voltage from 0V to a positive maximum erase voltage $V_{emax}$ and hold both voltages for a predefine programming time $T_{prog}$ (compared to the programming sequence for the all-PMOS NVM cell 100, the erase voltage $V_e$ is now ramped up along with the control voltage $V_c$ in order to prevent forwarding biasing the PN diode that is formed between the isolated P-well and the N-well (see FIGS. 3 and 4). The control voltage $V_c$ is then ramped down from maximum positive control voltage $V_{cmax}$ to 0V and the erase voltage $V_e$ is ramped down from the maximum positive erase voltage $V_{emax}$ to 0V. All cell electrodes in the array that are set to the positive inhibiting voltage $V_n$ are then returned to 0V.

After the above-described steps, the programming sequence is complete with no disturb condition in the non-programmed cells of the array.

Erase Sequence

For each NVM cell 200 in the array 600 to be erased, ramp up the erase voltage $V_e$ from 0V to the maximum positive erase voltage $V_{emax}$ and hold this voltage $V_{emax}$ for a predefined erase time $T_{erase}$; then ramp the erase voltage $V_e$ down from the maximum positive erase voltage $V_{emax}$ to 0V. All other electrodes of the cell are set to 0V.

Read Sequence For each NVM cell 200 in the array 600 to be read, set the first array word line W1 and the second array word line W2 to the positive inhibiting voltage $V_n$ and set the first array bit line B1 and the second array bit line B2 to a voltage difference of about 1V (e.g., sufficient enough voltage to be able to read the cell current while preventing disturb to the programmed cells). All other electrodes of the cell are set to 0V.

Those skilled in the art will appreciate that the voltage levels utilized in the programming, erase and read sequences will depend upon the thickness of the gate oxide utilized in the NVM cell's transistors. For example, for a gate oxide thickness of 60-80Å, $V_n\sim=3.3V$, $V_{cmax}=V_{emax}\sim=10V$, with $T_{prog}=T_{erase}\sim=20\text{-}50$ msec. For a gate oxide thickness of 120Å, $V_n\sim=5.0V$, $V_{cmax}=V_{emax}\sim=16V$, with $T_{prog}=T_{erase}\sim=20\text{-}50$ msec.

Referring to FIG. 2, adding the first NMOS pass transistor PG1 and the second NMOS pass transistor PG2 to the NVM cell 200 allows the drain and source regions of the NMOS data transistor $N_d$ to be floating for non-programmed cells during the programming sequence, as described above, as opposed to being set to a fixed voltage $V_n$ in the case of the FIG. 1 all-PMOS NVM cell 100. This allows the drain and source regions of the data transistor $N_d$ to rise above the $V_n$ level as the control voltage $V_c$ and the erase voltage $V_e$ are ramped up from 0V to $V_{cmax}$ and $V_{emax}$, respectively, during the programming sequence. As a result, little or no negative charge is trapped to the floating gate of non-programmed NVM cells. Thus, non-programmed cells retain their initial voltage condition (usually the condition after an erase sequence, which is performed before the programming sequence), which is usually at a level of more than $V_n$ above that of programmed NVM cells. This means that the maximum possible voltage difference between the floating gate of a programmed NVM cell and the floating gate of a non-programmed NVM cell is usually more than $V_n$. The non-programmed cells with this condition are typically referred to as non-disturbed cells. Since the voltage difference between the floating gate of programmed NVM cells and the floating gate of non-programmed NVM cells in the case of the 5-transistor NVM cell 200 is larger than the difference in the case of the all-PMOS NVM cell 100, the NVM cell 200 has superior noise margin and data retention time compared to the NVM cell 100. At the same time, the 5-transistor NVM cell 200 still retains the advantages of the reverse Fowler-Nordheim tunneling programming technique of the FIG. 1 all-PMOS NVM cell 100.

It should be understood that the particular embodiments of the present invention described above have been provided by way of example and that other modifications may occur to those skilled in the art without departing from the scope of the invention as expressed in the appended claims and their equivalents.

What is claimed is:

1. A non-volatile memory (NVM) cell comprising:
   an NMOS control transistor having commonly-connected source, drain and bulk region electrodes and a gate electrode connected to a storage node;
   a PMOS erase transistor having commonly-connected source, drain and bulk region electrodes and a gate electrode connected to the storage node;
   an NMOS data transistor having source, drain and bulk region electrodes and a gate electrode connected to the storage node, the bulk region electrode being connected to a common bulk node;
   a first NMOS pass gate transistor having a source electrode connected to the drain electrode of the NMOS data transistor, a drain electrode, a bulk region electrode connected to the common bulk node, and a gate electrode; and
   a second NMOS pass gate transistor having a drain electrode connected to the source electrode of the NMOS data transistor, a source electrode, a bulk region electrode connected to the common bulk node, and a gate electrode.

2. A method of programming a non-volatile memory (NVM) cell, the NVM cell including an NMOS control transistor having commonly-connected source, drain and bulk electrodes and a gate electrode connected to a storage node, a PMOS erase transistor having commonly-connected source, drain and bulk region electrodes and a gate electrode connected to the storage node, an NMOS data transistor having source, drain and bulk region electrodes and a gate electrode connected to the storage node, the bulk region electrode being connected to a common bulk node, a first NMOS pass gate transistor having a source electrode connected to the drain electrode of the NMOS data transistor, a drain electrode connected to a first array bit line, a bulk region electrode connected to the common bulk node and a gate electrode connected to a first array word line, and a second NMOS pass gate transistor having a drain electrode connected to the source electrode of the NMOS data transistor, a source electrode connected to a second array bit line, a bulk region electrode connected to the common bulk node and a gate electrode connected to a second array word line, the NVM cell programming method comprising:
   setting the source, drain, bulk region and gate electrodes of the NMOS control transistor, the PMOS erase transistor and the NMOS data transistor of the NVM cell to 0V;
   setting either the first array word line to a positive inhibiting voltage and the first array bit line to 0V, or setting the second array word line to the positive inhibiting voltage and the second array bit line to 0V, or both, while setting the common bulk node to 0V;
   ramping up a control voltage applied to the commonly-connected source, drain, and bulk region electrodes of the NMOS control transistor from 0V to a maximum positive control voltage and an erase voltage applied to the commonly-connected source, drain, and bulk region electrodes of the PMOS erase transistor from 0V to a maximum positive erase voltage for a predefined programming time;
   ramping down the control voltage from the maximum positive control voltage to 0V and the erase voltage from the maximum positive erase voltage to 0V; and
   returning all electrodes set to the positive inhibiting voltage to 0V.

3. The programming method of claim 2, wherein the positive inhibiting voltage is about 3.3V.

4. The programming method of claim 2, wherein the positive inhibiting voltage is about 5.0V.

5. A method of programming a non-volatile memory (NVM) cell array that includes a plurality of NVM cells, each NVM cell in the array including an NMOS control transistor having commonly-connected source, drain and bulk electrodes and a gate electrode connected to a storage node, a PMOS erase transistor having commonly-connected source, drain and bulk region electrodes and a gate electrode connected to the storage node, an NMOS data transistor having source, drain and bulk region electrodes and a gate electrode connected to the storage node, the bulk region electrode being connected to a common bulk node, a first NMOS pass gate transistor having a source electrode connected to the drain electrode of the NMOS data transistor, a drain electrode connected to a first array bit line, a bulk region electrode connected to the common bulk node and a gate electrode connected to a first array word line, and a second NMOS pass gate transistor having a drain electrode connected to the source electrode of the NMOS data transistor, a source electrode connected to a second array bit line, a bulk region electrode connected to the common bulk node and a gate electrode connected to a second array word line, the NVM cell array programming method comprising:
   for each NVM cell in the NVM cell array, setting the source, drain, bulk region and gate electrodes of the NMOS control transistor, the PMOS erase transistor and the NMOS data transistor to 0V;
   for each NVM cell in the NVM cell array selected for programming, setting either the first array word line to a positive inhibiting voltage and the first array bit line to 0V, or the second array word line to the positive inhibiting voltage and the second array bit line to 0V, or both, while setting the common bulk node to 0V;
   for each NVM cell in the NVM cell array not selected for programming, setting the first and second array word lines to 0V while setting the first or second array bit lines, or both, to the positive inhibiting voltage or 0V, while setting the common bulk node to 0V, ramping up a control voltage applied to the commonly-connected source, drain, and bulk region electrodes of the NMOS control transistor from 0V to a maximum positive control voltage and an erase voltage applied to the commonly-connected source, drain, and bulk region electrodes of the PMOS erase transistor from 0V to a maximum positive erase voltage for a programming time;

ramping down the control voltage from the maximum positive control voltage to 0V and the erase voltage from the maximum positive erase voltage to 0V; and returning all electrodes in the NVM cell array that are set to the positive inhibiting voltage to 0V.

6. The programming method of claim 5, wherein the positive inhibiting voltage is about 3.3V.

7. The programming method of claim 5, wherein the positive inhibiting voltage is about 5.0V.

* * * * *